United States Patent
Ferguson et al.

(10) Patent No.: US 6,810,501 B1
(45) Date of Patent: Oct. 26, 2004

(54) SINGLE CYCLE CYCLIC REDUNDANCY CHECKER/GENERATOR

(75) Inventors: Dennis C. Ferguson, Mountain View, CA (US); Devereaux C. Chen, Cupertino, CA (US); Ramesh Padmanabhan, Los Altos, CA (US); Chang-Hong Wu, Cupertino, CA (US); Thomas Michael Skibo, Palo Alto, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 698 days.

(21) Appl. No.: 09/752,829

(22) Filed: Jan. 3, 2001

(51) Int. Cl.[7] .............................................. H03M 13/00
(52) U.S. Cl. ....................... 714/781; 714/757; 714/758; 714/781
(58) Field of Search .................... 714/781, 757, 714/758, 52, 759, 761, 804, 801, 762, 787, 788; 708/521, 530–531, 534; 370/392, 394, 395.31, 399, 395.51

(56) References Cited

U.S. PATENT DOCUMENTS

| | | | | |
|---|---|---|---|---|
| 5,084,891 A | * | 1/1992 | Ariyavisitakul et al. | .... 714/775 |
| 5,323,403 A | * | 6/1994 | Elliott | ......................... 714/757 |
| 5,499,224 A | * | 3/1996 | Sanada | ...................... 369/47.2 |
| 5,878,057 A | * | 3/1999 | Maa | ........................... 714/757 |
| 6,009,547 A | * | 12/1999 | Jaquette et al. | ............. 714/758 |
| 6,195,780 B1 | * | 2/2001 | Dravida et al. | ............. 714/758 |

OTHER PUBLICATIONS

Sait, et al. 'Hardware design and VLSI implementation of a byte–wise CRC generator chip,' IEEE Transactions on Consumer Electronics, Feb. 1995, pp: 195–200, vol. 41, Issue: 1.*

Simpson, W., Editor, "PPP in HDLC–like Framing", STD 51, RFC 1662, Daydreamer, Jul. 1994, http://www.faqs.org/rfcs/rfc1662.html, pp. 1–18.

Ganssle, Jack, Software by Design: "Computing CRCs in Parallel," Circuit Cellar Ink, Jun./Jul. 1989, pp. 55, 56, 58, and 59.

* cited by examiner

Primary Examiner—Guy J. Lamarre
(74) Attorney, Agent, or Firm—Harrity & Snyder LLP

(57) ABSTRACT

A system updates a cyclic redundancy check (CRC) value. The system receives data containing an arbitrary number of valid and invalid portions. The valid portions are positioned adjacent to one another. The system also receives a signal representing a quantity of valid portions in the data and a current CRC value. The system updates the current CRC value using the data and signal in a single clock cycle.

14 Claims, 8 Drawing Sheets crc16_1[15:0] the result (which is crc16 updated by 1 byte of data)

CRC16_1

SINGLE CYCLE CYCLIC REDUNDANCY CHECKER/GENERATOR

BACKGROUND OF THE INVENTION

A. Field of the Invention

The present invention relates generally to routing systems and, more particularly, to systems and methods for performing cyclic redundancy checks on data transmitted in a communication system.

B. Description of Related Art

Cyclic Redundancy Checking (CRC) ensures the accuracy of frames transmitted between devices in a frame relay network. In practice, an originating device generates a CRC value based on the content of the frame to be transmitted and transmits the CRC value with the frame. A destination device compares the received CRC value to a recomputed CRC value to determine whether the frame was received correctly.

Several approaches exist for generating and checking CRCs. One such approach is described in Section C of RFC1662, "PPP in HDLC-like Framing," July 1994, pp. 18–24. As described therein, the fast Frame Check Sequence (FCS) implementation requires successive iterations (16 for a 16 bit FCS, 32 for a 32 bit FCS) over the following loops:

$Fcs=(fcs>>8)\hat{}fcstab\_16[(fcs\hat{}(*cp++))\& 0xff]$ ... for FCS16

$Fcs=(fcs>>8)\hat{}fcstab\_32[(fcs\hat{}(*cp++))\& 0xff]$ ... for FCS32 where a memory access to an FCS lookup table (fcstab_16 and fcstab_32, respectively) is required for each loop. It will be appreciated that such an approach is inappropriate for extremely high performance applications (e.g., OC192) due to its iterative nature and concomitant memory accesses.

In high performance applications, conventional CRC generating and checking approaches face several problems. A first problem is speed. Typically, high performance routers require line rate performance (i.e., bits are processed as they arrive off the wire). The ability to calculate a CRC checksum in a single clock cycle is highly desirable to meeting this design goal.

A second problem is data width. For a given clock rate, the wider the checksum that can be calculated, the higher the line rate that can be supported. As such, high performance routers need the ability to handle wide input data (e.g., 128 bits for OC192 applications). Moreover, since the CRC check can occur over all, some, or none of the bits in an incoming bit stream, high performance routers need the ability to perform the CRC on a bit stream having an arbitrary number of invalid bits.

Therefore, there exists a need for systems and methods that improve CRC operations in a high performance environment.

SUMMARY OF THE INVENTION

Systems and methods, consistent with the present invention, address this and other needs by providing a cyclic redundancy checker/generator capable of performing a CRC operation in single cycle on data having wide width and an arbitrary number of invalid bits.

In accordance with the purpose of the invention as embodied and broadly described herein, a method for updating a cyclic redundancy check (CRC) value includes receiving data containing valid and invalid portions. The valid portions are positioned adjacent to one another. The method also receives first information representing the number of valid portions in the data and second information representing a current CRC value. The method determines the updated CRC value based on the data, first information, and second information.

In another implementation consistent with the present invention, a CRC includes a plurality of CRC units and at least one multiplexer. The CRC units receive data, containing valid and invalid portions, the valid portions being adjacent to one another, and a current CRC value, and generate CRC outputs based on the received data and current CRC value. The multiplexer receives the CRC outputs and information representing a number of valid portions in the received data, and outputs one of the received CRC outputs based on the information.

In yet another implementation consistent with the present invention, a CRC includes a first input port, a second input port, a third input port, CRC logic, and an output port. The first input port receives first data to be added to a current CRC value. The first data contains valid and invalid portions, where the valid portions are adjacent to one another. The second input port receives second data representing a number of valid portions in the first data. The third input port receives the current CRC value. The CRC logic is coupled to the first, second and third ports and configured to generate an updated CRC value based on the first data, second data, and current CRC value. The output port is coupled to the CRC logic and configured to output the updated CRC value.

In still another implementation consistent with the present invention, a network device includes a routing engine and a packet forwarding engine. The routing engine maintains one or more routing tables and a forwarding table. The packet forwarding engine includes a CRC and a transmitter. The CRC receives a packet having valid portions and invalid portions, the valid portions being adjacent, receives a signal representing a number of valid portions in the packet, receives a current CRC value, and determines an updated CRC value based on the received packet, signal, and current CRC value. The transmitter appends the updated CRC value to the packet and transmits the packet.

In still another implementation consistent with the present invention, a method for updating a CRC value is disclosed. The method includes receiving data containing an arbitrary number of valid and invalid portions, the valid portions being positioned adjacent to one another; receiving a signal representing a quantity of valid portions in the data; receiving a current CRC value; and updating the current CRC value using the data and signal in a single clock cycle.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Systems and methods, consistent with the present invention, provide a CRC checker/generator capable of performing CRC operations in a single cycle. The CRC checker/generator can handle data having a wide width (e.g., 128 bits) and an arbitrary number of invalid bits.

While the foregoing description focuses on a SONET environment, it will be appreciated that implementations consistent with the present invention are equally applicable to other environments.

Exemplary Router Configuration

Figure 1:
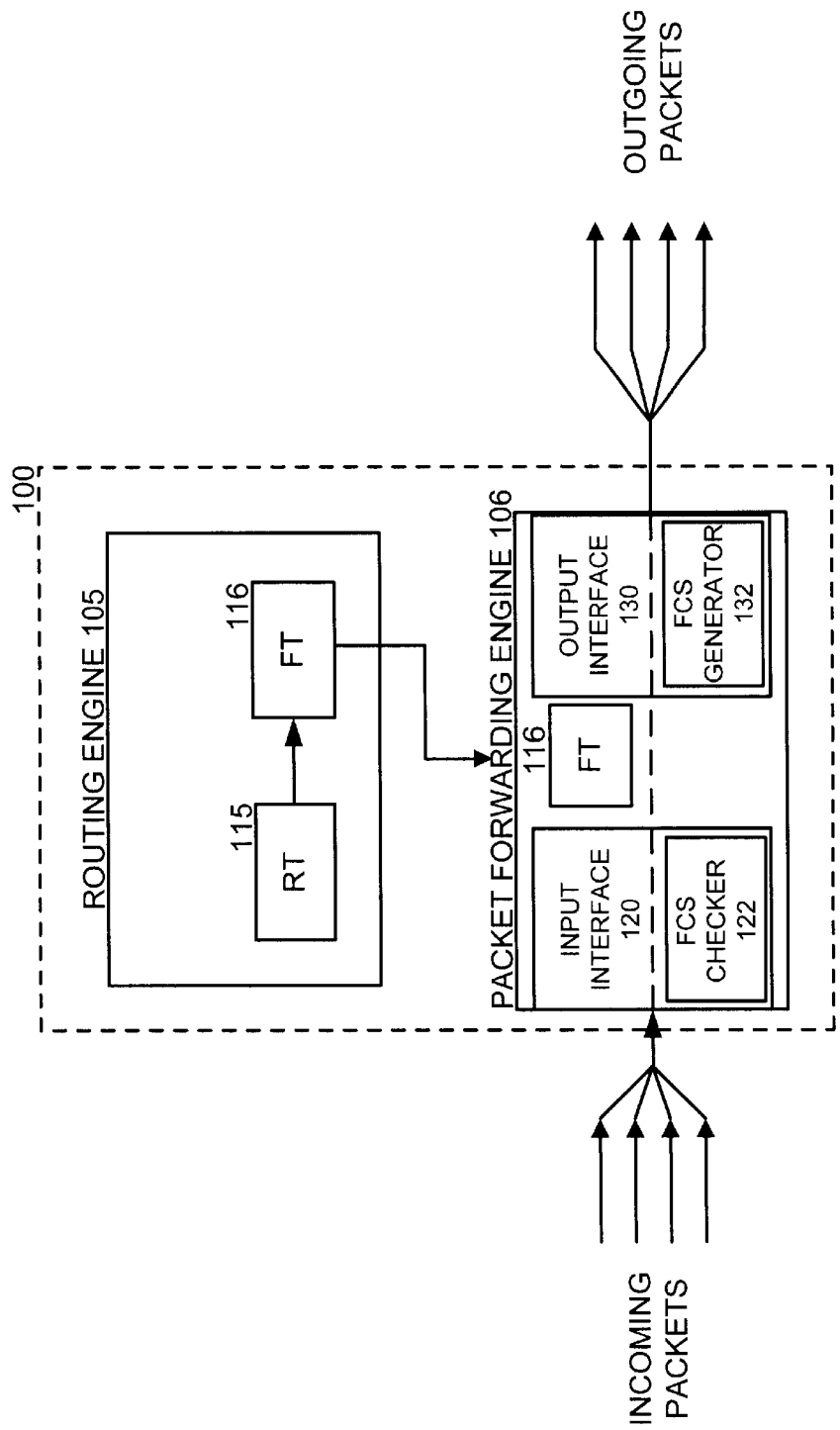
FIG. 1 illustrates an exemplary configuration of a router consistent with the present invention.

FIG. 1 illustrates an exemplary configuration of a router 100 consistent with the present invention. In general, router 100 receives incoming packets, determines the next destination (the next "hop" in the network) for the packets, and outputs the packets as outbound packets on physical links that lead to the next destination. In this manner, packets "hop" from router to router in a network until reaching their final destination.

As illustrated, router 100 includes routing engine 105 and a packet forwarding engine (PFE) 106. Routing engine 105 may maintain one or more routing tables (RTs) 115 and a forwarding table (FT) 116. Through routing tables 115, routing engine 105 consolidates routing information that the routing engine 105 learns from the routing protocols of the network. From this routing information, the routing protocol process may determine the active routes to network destinations and install these routes into forwarding table 116. Packet forwarding engine 106 may consult forwarding table 116 when determining the next destination for the incoming packets.

The packet forwarding engine 106 may also include an input interface 120 and an output interface 130. The input interface 120 may perform initial processing on an incoming bit stream. When the bit stream is received, for example, via a point-to-point protocol (PPP) over SONET environment, the incoming bit stream may be in the form of HDLC-like frames and the processing may include HDLC de-encapsulation and octet destuffing. The PPP HDLC-like frame structure is defined in RFC1662, "PPP in HDLC-like Framing," July 1994, pp. 4–7.

The input interface 120 may include a frame check sequence (FCS) checker 122 that performs cyclic redundancy checks on the received data. The received data may include valid and invalid bytes. Valid bytes refer to those bytes to be used in the CRC calculation. Invalid bytes, on the other hand, refer to those bytes that not used in the CRC calculation, such as the Flag sequence 0x7E. Since it may be difficult to simultaneously identify and drop the invalid bytes and generate the FCS in a single cycle, the FCS checker is split into two sub-blocks: a splitter/packer and CRC logic. The splitter/packer splits packets out from the incoming bit stream and packs the bytes of the packets such that all valid bytes are adjacent. This takes a huge piece of hard work out of the CRC logic, which calculates the FCS over the valid bytes. A major advantage of this approach is that the splitting and packing operations do not have to occur in a single clock cycle and, therefore, can be pipelined. By providing a wide bus between the splitter/packer and the CRC logic, this allows the CRC logic to calculate the FCS in a single cycle on a large amount of data.

Figure 2:
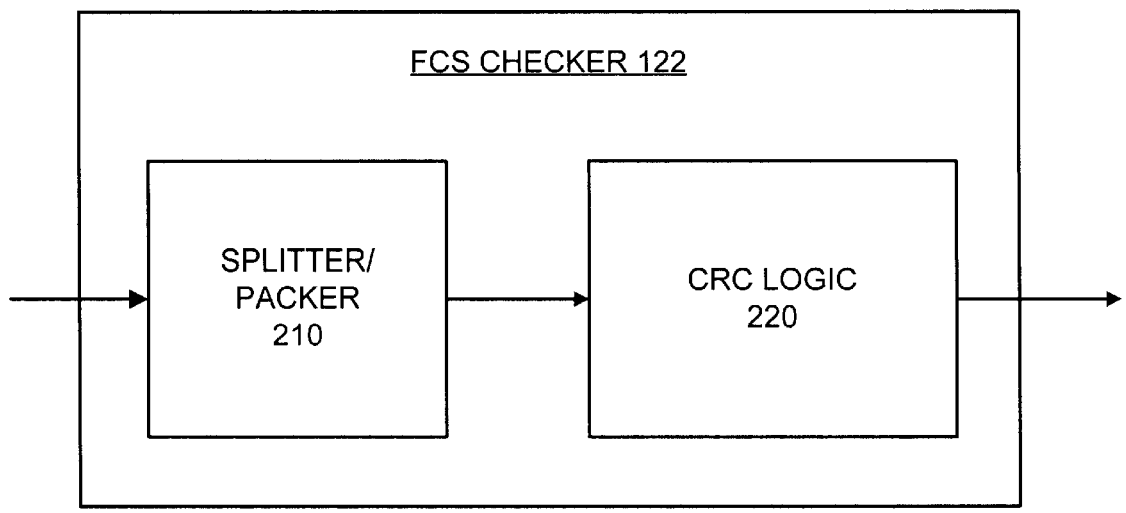
FIG. 2 illustrates an exemplary configuration, consistent with the present invention, of the FCS checker of FIG. 1.

FIG. 2 illustrates an exemplary configuration, consistent with the present invention, of the FCS checker 122 of FIG. 1. The FCS checker 122 may include a splitter/packer 210 and CRC logic 220.

The splitter/packer 210 may include one or more devices that split valid bytes out from the invalid bytes and pack them such that all valid bytes are adjacent. The splitter/packer 210 may, for example, perform these operations as described in copending, commonly assigned U.S. patent application Ser. No. 09/637,709, filed Aug. 15, 2000, the disclosure of which is incorporated by reference herein. Other alternative techniques for performing the splitting and packing operations may alternatively be used. The splitter/packer 210 may also count the number of valid bytes in the received bit stream.

The CRC logic 220 receives the output of the splitter/packer 210 and determines, as will be described in more detail below, a CRC checksum on the valid bytes in a single cycle. Since packets can span multiple cycles, CRC logic 220 may store the output checksum in registers so that it can be added to an incoming bit stream.

Figure 3:
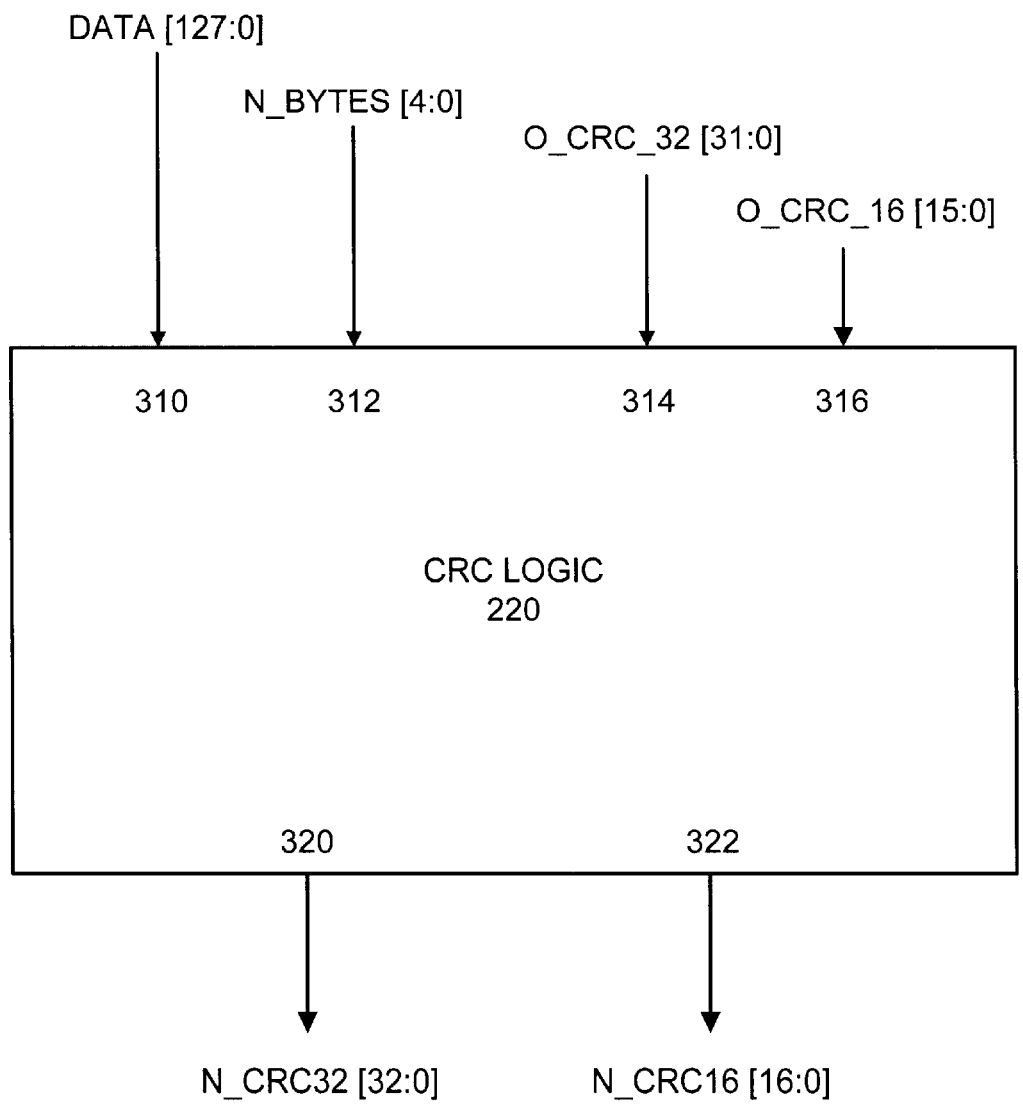
FIG. 3 illustrates an exemplary configuration of the CRC logic of FIG. 2.

FIG. 3 illustrates an exemplary configuration of the CRC logic 220 of FIG. 2. As illustrated, the CRC logic 220 includes four input ports 310–316 and two output ports 320–322. Input port 310 may receive the data to be added to the CRC this cycle (DATA[127:0]). Between 0 and 16 bytes of data may be added to the CRC logic 220 in a cycle. If, for example, 3 bytes are added, the first byte is data [7:0], the second byte is data [15:8], the third byte is data [23:16], and data [127:24] is unused.

Input port 312 may receive a value representing the number of valid bytes in the data input at port 310 (N_BYTES[4:0]). In an implementation consistent with the present invention, the value may be 0–16 inclusive. When the CRC logic 220 performs a 32 bit CRC, input port 314 may receive a value representing the current 32 bit CRC (O_CRC32[31:0]), i.e., the value to be updated in this cycle. The value may be 32'hffff_ffff if this is the start of a packet, or the result from a previous cycle otherwise. When the CRC logic 220 performs a 16 bit CRC, input port 316 may receive a value representing the current 16 bit CRC (O_CRC16[15:0]), i.e., the value to be updated in this cycle. The value may be 15'hffff if this is the start of the packet, or the result from a previous cycle otherwise.

Output port 320 may output a value representative of the updated 32 bit CRC (N_CRC32[32:0]). N_CRC32[32] may be a Boolean value indicating whether the remainder is a correct end of a packet. N_CRC[31:0] may represent the actual updated 32 bit CRC.

Output port 322 may output a value representative of the updated 16 bit CRC (N_CRC16[16:0]). N_CRC16[16] may be a Boolean value indicating whether the remainder is a correct end of a packet. N_CRC[15:0] may represent the actual updated 16 bit CRC.

Figure 4:
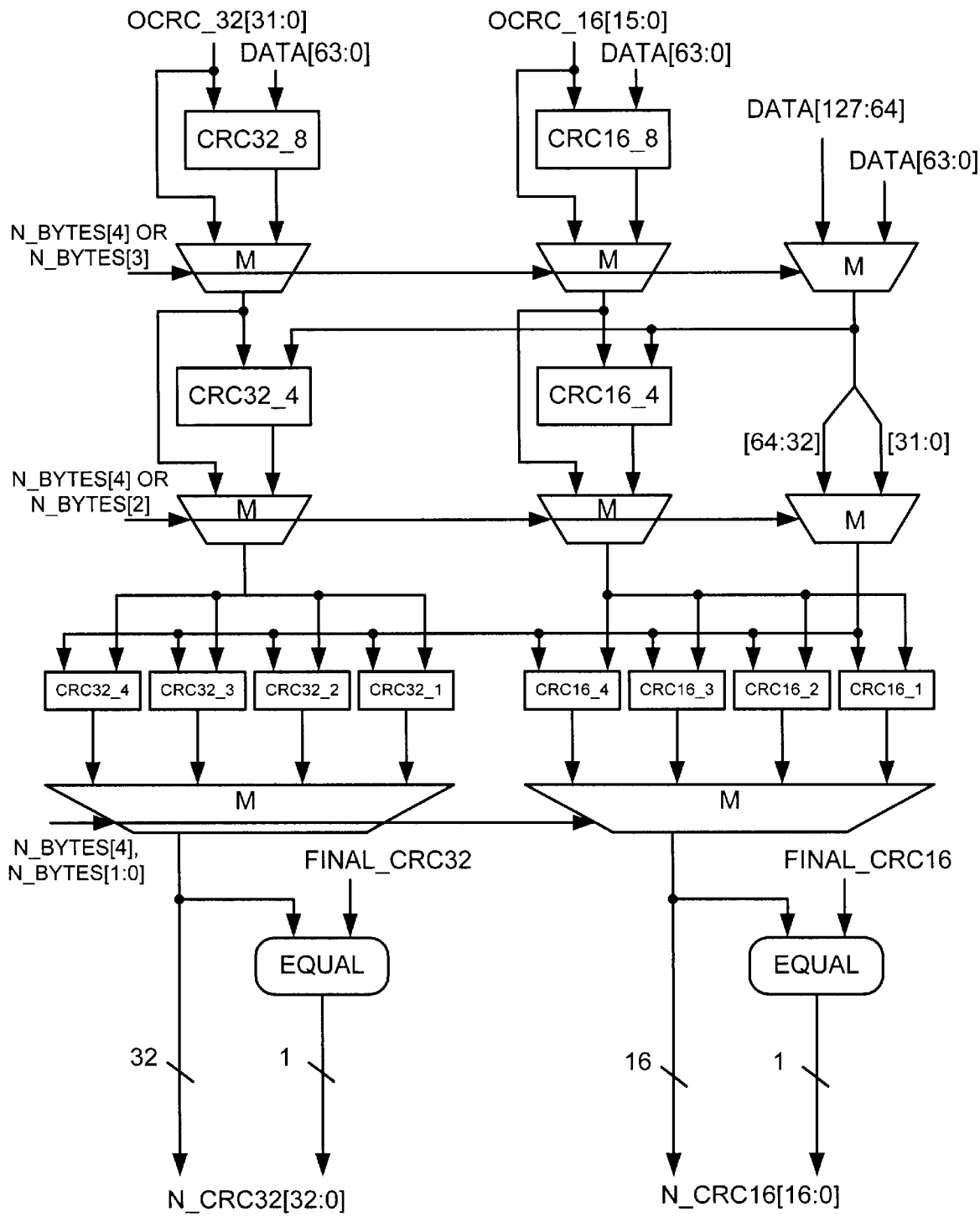
FIG. 4 illustrates the CRC logic of FIG. 3 in greater detail.

FIG. 4 illustrates the CRC logic 220 of FIG. 3 in greater detail. As illustrated, the CRC logic 220 may include individual groups of CRC units (CRC32_8, CRC32_4, etc. and CRC16_8, CRC 16_4, etc.) for performing either a 32 bit or 16 bit CRC and a group of multiplexers (M). The multiplexers M may include conventional multiplexers that allow for selection of one of multiple inputs based on control signals, such as the number of valid bytes (N_BYTES[4:0]) in the incoming data (DATA[127:0]).

As described above, the CRC logic 220 outputs a CRC value and a Boolean value (output of the EQUAL operation) indicating whether the remainder is a correct end of a packet.

Figure 5:
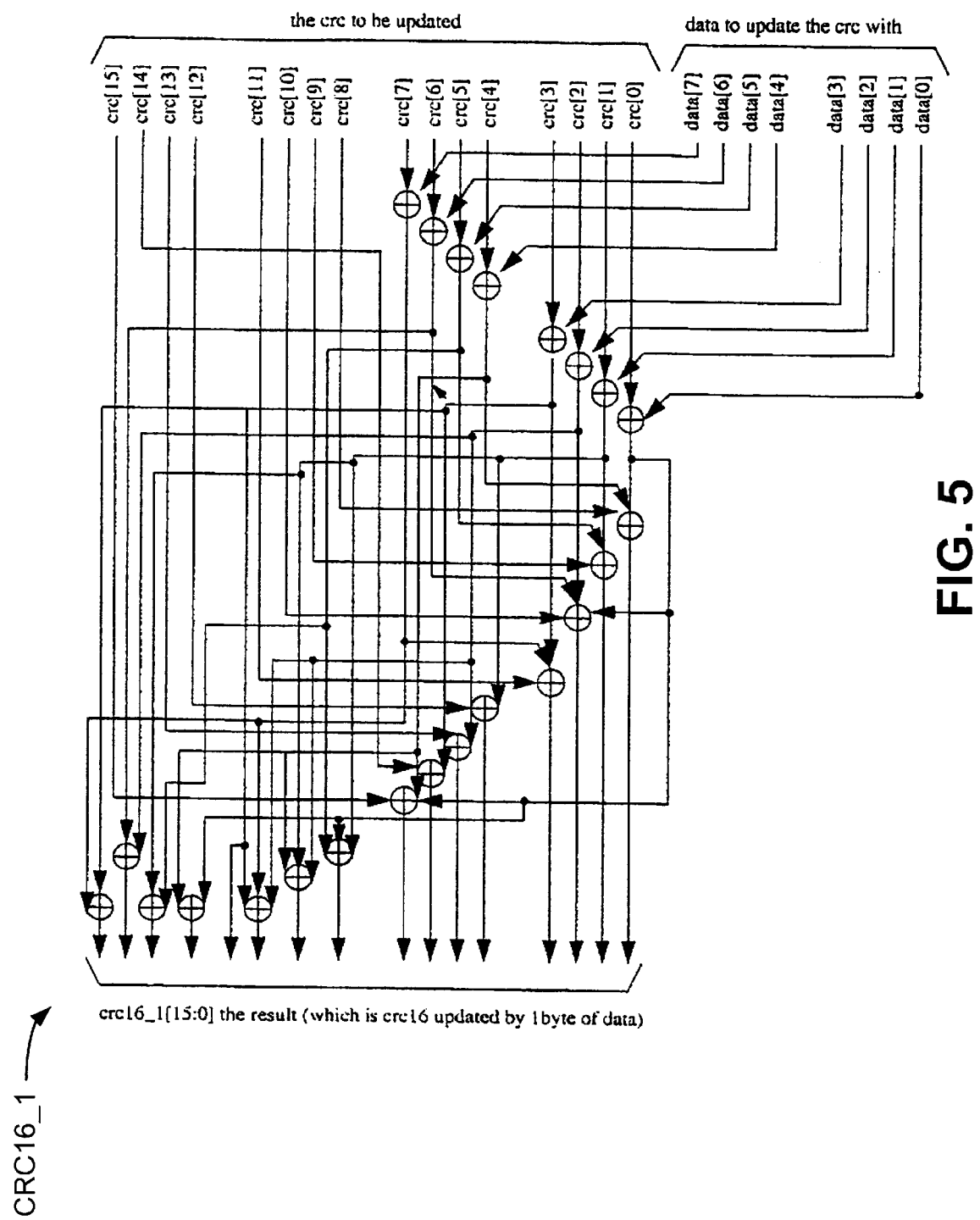
FIG. 5 illustrates an exemplary configuration, consistent with the present invention, of the CRC unit CRC16_1 of FIG. 4.

FIG. 5 illustrates an exemplary configuration, consistent with the present invention, of the CRC unit CRC16_1 of FIG. 4. It will be appreciated that the other CRC units of FIG. 4 may be similarly configured.

As illustrated, CRC unit CRC16_1 includes a group of exclusive OR (XOR) gates that receive as inputs the 16 bit CRC to be updated (CRC[15:0]) and the data with which to update the 16 bit CRC (DATA[7:0]). The CRC unit CRC16_1 outputs a 16 bit CRC result that has been updated by 1 byte of data.

In order to achieve fast single cycle operation, the CRC determination may be performed using dedicated hardware. The CRC logic 220 operates on the assumption that the valid bytes in the incoming bit stream are contiguous, as would have been achieved using the splitter/packer 210. Separate and dedicated hardware may be used to determine different CRC's assuming 1 valid input byte, 2 valid input bytes, . . . , N valid input bytes and then the number of valid incoming bytes may be used to select the final result.

In principle, an arbitrary granularity can be supported. While the use of bytes is assumed above, it will be appreciated that implementations consistent with the present invention are not so limited. For example, one could have used an arbitrary number of bits as the quantum ranging from 1 to 128 or above.

It will be appreciated that different arrangements of CRC computation trees or different widths may be used to meet cycle time constraints. For example, FIG. 4 illustrates the CRC logic 220 as an area-efficient selection 3-level tree. According to another implementation, the CRC logic 220 may be constructed as a single-level tree consisting of 16 separate CRC units for a 16 bit CRC and 16 additional CRC units for a 32 bit CRC. It is important to note that while this type of configuration may be able to achieve a faster result, it may require a larger area. Depending on the available cycle time, one can implement n-level selection trees that offer the required performance using a minimal area.

Returning to FIG. 1, the output interface 130 may process outgoing packets. When the packets are to be routed via a PPP over SONET environment, for example, the output interface 130 may perform HDLC encapsulation and octet stuffing in a well-known manner. The output interface 130 may include a frame check sequence (FCS) generator 132 for generating a FCS to be transmitted with the outgoing packets.

Figure 6:
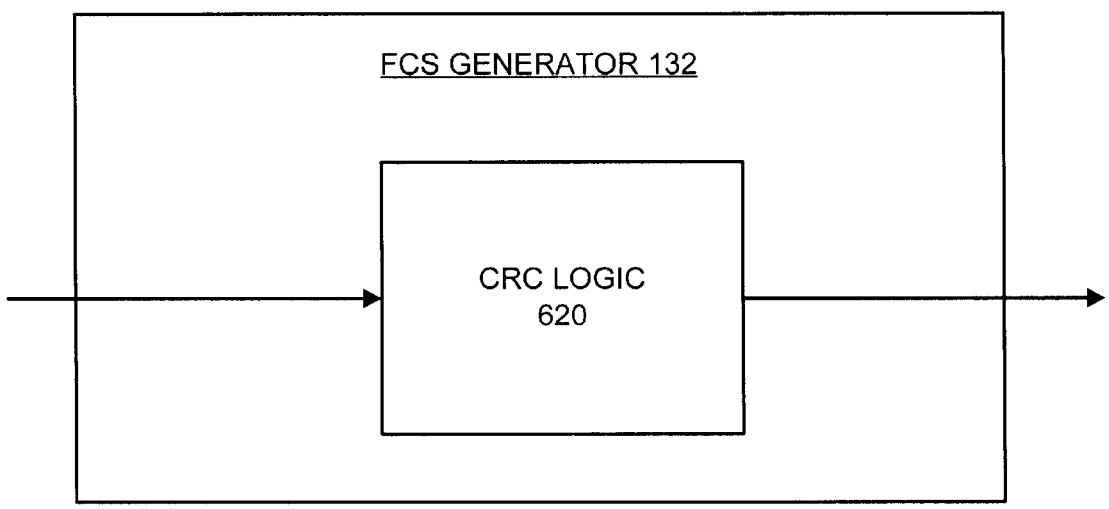
FIG. 6 illustrates an exemplary configuration, consistent with the present invention, of the FCS generator of FIG. 1.

FIG. 6 illustrates an exemplary configuration, consistent with the present invention, of the FCS generator 132 of FIG. 1. As illustrated, the FCS generator 132 may include CRC logic 620. The CRC logic 620 may be configured similar to the CRC logic 220 described above with respect to the FCS checker 122.

Exemplary Processing

Figure 7:
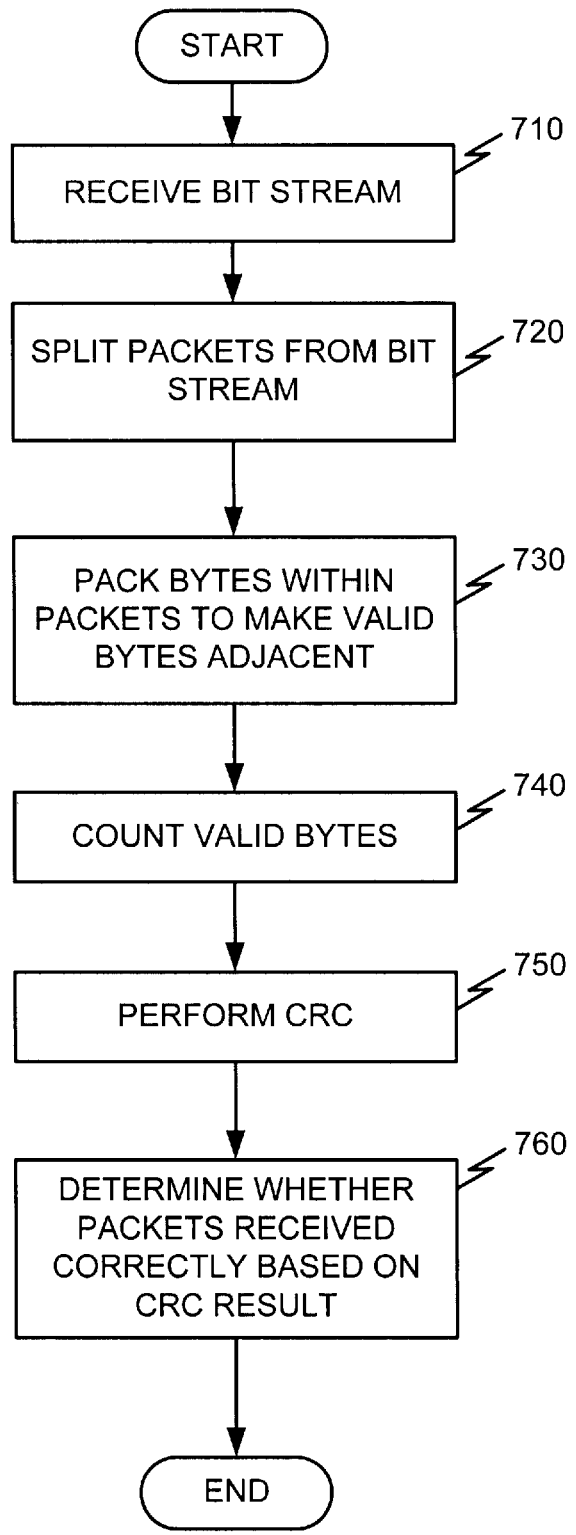
FIG. 7 illustrates an exemplary process, consistent with the present invention, for performing error checking for received packets.

FIG. 7 illustrates an exemplary process, consistent with the present invention, for performing error checking for received packets. Processing may begin with a device, such as router 100, receiving a transmitted bit stream [act 710]. The router's splitter/packer 210 may split packets out from the incoming bit stream [act 720] and pack the bytes of the packets such that all valid bytes are adjacent and contiguous [act 730]. Assuming, for example, that the incoming bit stream includes frames transmitted in a packet over SONET environment, the splitter/packer 210 may consider the Flag sequence 0x7E of a frame as an invalid byte. The splitter/packer 210 may also count the number of valid bytes [act 740] and transmit this information, along with the received data, to the CRC logic 220.

The CRC logic 220 may then perform a cyclic redundancy check using the received data in a single cycle [act 750]. Since packets can span multiple cycles, the CRC logic 220 may store the resulting checksum in registers so that it can be added to the incoming data. The CRC logic 220 may output an updated CRC value and an indication of whether the remainder is a correct end of packet. The router 100 may determine, based on the result of the CRC operation, whether the packets were received correctly [act 760].

Figure 8:
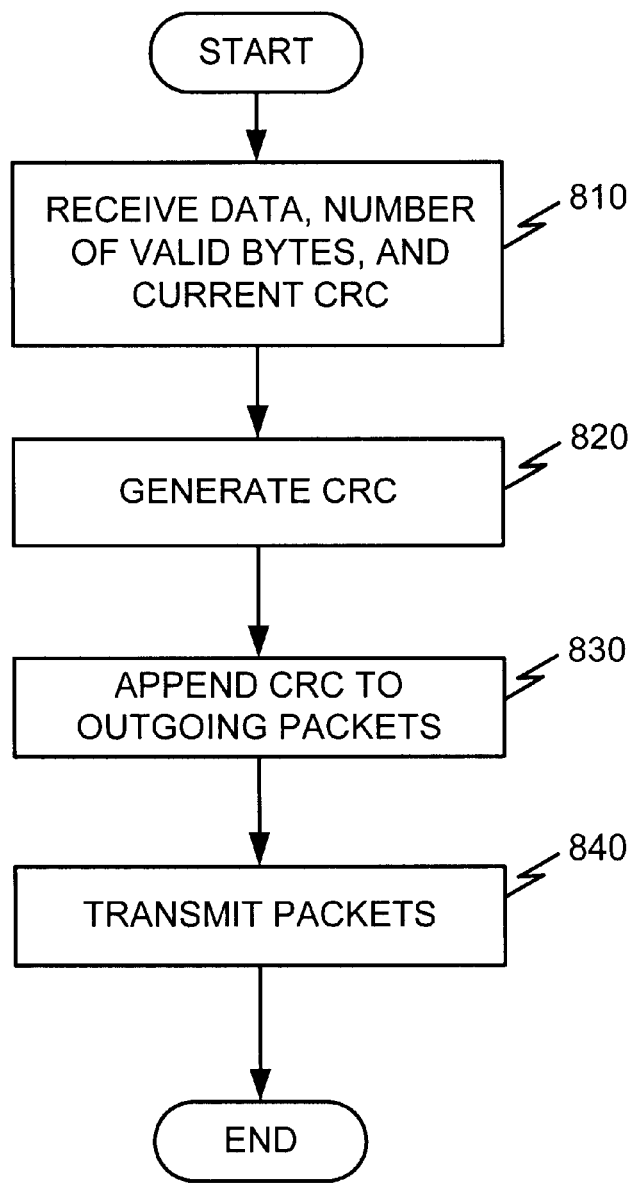
FIG. 8 illustrates an exemplary process, consistent with the present invention, for transmitting packets.

FIG. 8 illustrates an exemplary process, consistent with the present invention, for transmitting packets. Processing may begin with a device, such as router 100, having one or more packets to be transmitted. The router's CRC logic 620 may receive data for generating the CRC or data for updating a current CRC, the number of valid bytes in the data, and, when the CRC is being updated, a current 32 bit or 16 bit CRC value [act 810]. The CRC logic 620 may then generate the CRC in a single cycle [act 820].

The router 100 may append the CRC value to the packets for which the CRC was generated [act 830]. It should be noted that the CRC output of the CRC logic 620 is typically the complement of what the router 100 inserts at the end of an outgoing packet, and is byte swapped; that is, the four bytes that the router 100 may insert at the end of a packet for a 32 bit FCS may be ~N_CRC32[7:0], ~N_CRC32[15:8], ~N_CRC32[23:16], and ~N_CRC32[31:24], in that order. For a 16 bit FCS, the router 100 may insert the following two bytes at the end of a packet: ~N_CRC16[7:0] and ~N_CRC [15:8], in that order. Once inserted, the router 100 may transmit the packets [act 840].

CONCLUSION

Systems and methods, consistent with the present invention, provide a CRC checker/generator capable of performing CRC operations in a single cycle. The CRC checker/generator can perform the single cycle CRC operation on data having a wide width (e.g., 128 bits) and an arbitrary number of invalid bytes.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, while series of acts have been presented with respect to FIGS. 7 and 8, the order of the acts may be altered in other implementations consistent with the present invention. No element, act, or instruction used in the description of the present application should be construed as critical or essential to the invention unless explicitly described as such.

The scope of the invention is defined by the following claims and their equivalents.

What is claimed is:

1. A method for updating a cyclic redundancy check (CRC) value, comprising:
   receiving data containing valid and invalid portions, the valid portions being adjacent to one another;
   receiving first information representing the number of valid portions in the data;
   receiving second information representing a current CRC value; and
   determining the updated CRC value based on the data, first information, and second information.

2. The method of claim 1 wherein the receiving data, the receiving first information, the receiving second information, and the determining occurs in a single clock cycle.

3. A system for updating a cyclic redundancy check (CRC) value, comprising:
   means for receiving data containing valid and invalid portions, the valid portions being adjacent to one another;
   means for receiving first information representing the number of valid portions in the data;
   means for receiving second information representing a current CRC value; and
   means for determining the updated CRC value based on the data, first information, and second information.

4. In a network device, a cyclic redundancy checker (CRC) comprising:
   a plurality of CRC units configured to receive data, containing valid and invalid bits, the valid bits being adjacent to one another, and a current CRC value, and generate CRC outputs based on the received data and current CRC value; and
   at least one multiplexer configured to receive the CRC outputs and information representing a number of valid bits in the received data, and output one of the received CRC outputs based on the information.

5. The CRC of claim 4 wherein the plurality of CRC units is organized in a multiple level tree structure.

6. The CRC of claim 4 wherein the plurality of CRC units is organized in a single level tree structure.

7. In a network device, a cyclic redundancy checker (CRC) comprising:
   a first input port configured to receive first data to be added to a current CRC value, the first data containing valid and invalid portions, the valid portions being adjacent to one another;
   a second input port configured to receive second data representing a number of valid portions in the first data;
   a third input port configured to receive the current CRC value;
   CRC logic coupled to the first, second and third ports and configured to generate an updated CRC value based on the first data, second data, and current CRC value; and
   an output port coupled to the CRC logic and configured to output the updated CRC value.

8. The CRC of claim 7 wherein the third port comprises:
   a first sub-port configured to receive a current 32 bit CRC value; and
   a second sub-port configured to receive a current 16 bit CRC value.

9. The CRC of claim 7 wherein, when generating, the CRC logic is configured to:
   generate the updated CRC value in a single clock cycle.

10. The CRC of claim 9 wherein the first data includes 128 bits.

11. A network device comprising:
    a routing engine configured to maintain one or more routing tables and a forwarding table; and
    a packet forwarding engine including:
      a cyclic redundancy checker (CRC) configured to receive a packet having valid portions and invalid portions, the valid portions being adjacent, receive a signal representing a number of valid portions in the packet, receive a current CRC value, and determine an updated CRC value based on the received packet, signal, and current CRC value, and
      a transmitter configured to append the updated CRC value to the packet and transmit the packet.

12. The router of claim 11 wherein, when determining, the CRC is configured to:
    generate the updated CRC value in a single clock cycle.

13. A method for updating a cyclic redundancy check (CRC) value, comprising:
    receiving data containing an arbitrary number of valid and invalid portions, the valid portions being positioned adjacent to one another;
    receiving a signal representing a quantity of valid portions in the data;
    receiving a current CRC value; and
    updating the current CRC value using the received data and the received signal in a single clock cycle.

14. The method of claim 13 wherein the data includes 128 bits.

* * * * *